US008637884B2

(12) United States Patent
Park

(10) Patent No.: US 8,637,884 B2
(45) Date of Patent: Jan. 28, 2014

(54) LIGHT EMITTING DEVICE, METHOD OF MANUFACTURING THE SAME, LIGHT EMITTING APPARATUS, AND LIGHTING SYSTEM

(75) Inventor: Duk Hyun Park, Yeosu-si (KR)

(73) Assignee: LG Innotek Co., Ltd., Seoul (KR)

( * ) Notice: Subject to any disclaimer, the term of this patent is extended or adjusted under 35 U.S.C. 154(b) by 212 days.

(21) Appl. No.: 12/720,059

(22) Filed: Mar. 9, 2010

(65) Prior Publication Data

US 2010/0230702 A1    Sep. 16, 2010

(30) Foreign Application Priority Data

Mar. 10, 2009  (KR) .......................... 10-2009-0020134

(51) Int. Cl.
*H01L 33/46* (2010.01)
(52) U.S. Cl.
USPC .................. 257/98; 257/99; 257/E33.069
(58) Field of Classification Search
None
See application file for complete search history.

(56) References Cited

U.S. PATENT DOCUMENTS

| 6,597,018 | B2 * | 7/2003 | Nei ................................ 257/79 |
| 7,088,038 | B2 * | 8/2006 | Srivastava et al. ............ 313/501 |
| 7,199,401 | B2 * | 4/2007 | Tazima et al. .................... 257/99 |
| 7,352,006 | B2 * | 4/2008 | Beeson et al. .................... 257/79 |
| 7,372,078 | B2 * | 5/2008 | Jang et al. ........................ 257/98 |
| 7,432,119 | B2 * | 10/2008 | Doan .............................. 438/33 |
| 7,834,374 | B2 * | 11/2010 | Jang et al. ........................ 257/99 |
| 8,253,156 | B2 * | 8/2012 | Park ................................. 257/98 |
| 2003/0141506 | A1 * | 7/2003 | Sano et al. ....................... 257/78 |
| 2007/0018184 | A1 * | 1/2007 | Beeson et al. .................... 257/98 |
| 2007/0114552 | A1 | 5/2007 | Jang et al. |
| 2009/0278164 | A1 * | 11/2009 | Osawa et al. ................. 257/103 |
| 2010/0208763 | A1 * | 8/2010 | Engl et al. .................. 372/46.01 |
| 2010/0264440 | A1 * | 10/2010 | Park ................................. 257/98 |

FOREIGN PATENT DOCUMENTS

| DE | 10 2007 029 370 A1 | 11/2007 | |
| DE | 102007029370 | * 11/2008 | .............. H01L 33/40 |
| DE | 102007029370 A1 * | 11/2008 | .............. H01L 33/40 |
| WO | WO 2008/135013 A2 | 11/2008 | |
| WO | WO2008135013 | * 11/2008 | .............. H01L 33/00 |
| WO | WO 2008135013 A2 * | 11/2008 | .............. H01L 33/40 |
| WO | WO 2009069929 A2 * | 6/2009 | .............. H01L 33/10 |

OTHER PUBLICATIONS

Machine translation of WO2008135013.*
Chen, Po Han, Ching Liang Lin, Y. K. Liu, Te Yuan Chung, and Cheng-Yi Liu. "Diamond Heat Spreader Layer for High-Power Thin-GaN Light-Emitting Diodes." IEEE Photonics Technology Letters 20.10 (2008): 845-47.*
WIPO Publication WO2008135013.*

* cited by examiner

*Primary Examiner* — Thomas L Dickey
*Assistant Examiner* — Joseph Schoenholtz
(74) *Attorney, Agent, or Firm* — Birch, Stewart, Kolasch & Birch, LLP

(57) ABSTRACT

Disclosed is a light emitting device including a conductive substrate; a reflective layer on the conductive substrate; an etching protective layer on a peripheral portion of a top surface of the conductive substrate; and a light emitting structure, which is formed on the reflective layer and the etching protective layer such that the etching protective layer is partially exposed and includes a first conductive semiconductor layer, a second conductive semiconductor layer and an active layer between the first and second conductive semiconductor layers, wherein the etching protective layer includes a first refractive layer having a first refractive index and a second refractive layer having a second refractive index greater than the first refractive index.

14 Claims, 8 Drawing Sheets

LIGHT EMITTING DEVICE, METHOD OF MANUFACTURING THE SAME, LIGHT EMITTING APPARATUS, AND LIGHTING SYSTEM

The present application claims priority under 35 U.S.C. §119(a) of Korean Patent Application No. 10-2009-0020134 filed on Mar. 10, 2009, which is hereby incorporated by reference in its entirety.

BACKGROUND

The embodiment relates to a light emitting device, a method of manufacturing the same, and a light emitting apparatus.

A light emitting diode includes a light emitting structure having a first conductive semiconductor layer, an active layer and a second conductive semiconductor layer and the light emitting structure emits light as power is applied thereto.

The light emitting structure is formed on a growth substrate, such as a sapphire substrate, as an epitaxial layer, and a reflective layer is formed on the light emitting structure. Then, a conductive substrate is formed on the reflective layer and the growth substrate is removed, thereby obtaining a vertical type light emitting diode.

SUMMARY

The embodiment provides a light emitting device having an improved structure, a method of manufacturing the same and a light emitting apparatus.

The embodiment provides a light emitting device capable of improving light efficiency, a method of manufacturing the same and a light emitting apparatus.

According to the embodiment, there is provided a light emitting device comprising: a conductive substrate; a reflective layer on the conductive substrate; an etching protective layer on a peripheral portion of a top surface of the conductive substrate; and a light emitting structure, which is formed on the reflective layer and the etching protective layer such that the etching protective layer is partially exposed and includes a first conductive semiconductor layer, a second conductive semiconductor layer and an active layer between the first and second conductive semiconductor layers, wherein the etching protective layer includes a first refractive layer having a first refractive index and a second refractive layer having a second refractive index greater than the first refractive index.

According to the embodiment, there is provided a light emitting device package comprising: a package body; a light emitting device on the package body; an electrode electrically connected to the light emitting device; and an encapsulating layer surrounding the light emitting device. The light emitting device comprises: a conductive substrate; a reflective layer on the conductive substrate; an etching protective layer on a peripheral portion of a top surface of the conductive substrate; and a light emitting structure, which is formed on the reflective layer and the etching protective layer such that the etching protective layer is partially exposed, wherein the etching protective layer includes a first refractive layer having a first refractive index and a second refractive layer having a second refractive index greater than the first refractive index.

According to the embodiment, there is provided a lighting system comprising: a light emitting device package including a package body, a light emitting device on the package body, an electrode electrically connected to the light emitting device, and an encapsulating layer surrounding the light emitting device. The light emitting device comprises: a conductive substrate; a reflective layer on the conductive substrate; an etching protective layer on a peripheral portion of a top surface of the conductive substrate; and a light emitting structure, which is formed on the reflective layer and the etching protective layer such that the etching protective layer is partially exposed, wherein the etching protective layer includes a first refractive layer having a first refractive index and a second refractive layer having a second refractive index greater than the first refractive index.

DETAILED DESCRIPTION OF THE EMBODIMENTS

Figure 1:
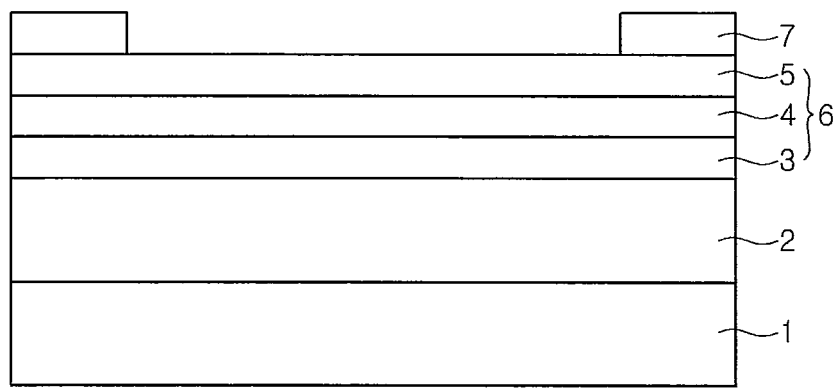
FIGS. 1 to 6 are sectional views showing a method of manufacturing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

FIGS. 1 to 6 are sectional views showing a method of manufacturing a light emitting device according to the embodiment.

Referring to FIG. 1, a nitride semiconductor layer 2 including a buffer layer is formed on a growth substrate 1, and a light emitting structure 6 including a first conductive semiconductor layer 3, an active layer 4 and a second conductive semiconductor layer 5 is formed on the nitride semiconductor layer 2.

Various substrates, such as $Al_2O_3$, Si, SiC, GaAs, ZnO, and MgO substrates, can be used as the growth substrate 1. The nitride semiconductor layer 2 may include an undoped GaN layer, and the light emitting structure 6 may include a GaN-based semiconductor layer.

The first conductive semiconductor layer 3 may include a group III-V compound semiconductor doped with a first conductive dopant. For instance, the first conductive semiconductor layer 3 may include GaN, AlN, AlGaN, InGaN, InN, InAlGaN, AlInN, AlGaAs, GaP, GaAs, GaAsP or AlGaInP. If the first conductive semiconductor layer 3 is an N type semiconductor layer, the first conductive dopant is an N type dopant, such as Si, Ge, Sn, Se, or Te. The first conductive semiconductor layer 3 may have a single layer structure or a multi-layer structure, but the embodiment is not limited thereto.

The active layer 4 is formed on the first conductive semiconductor layer 3 and may have one of a single quantum well structure, a multiple quantum well (MQW) structure, a quantum dot structure and a quantum wire structure. The active layer 4 can be prepared as a well/barrier layer by using group III-V compound semiconductor. For instance, the active layer 4 may include an InGaN well/GaN barrier layer or an InGaN well/AlGaN barrier layer.

A clad layer can be interposed between the active layer 4 and the first conductive semiconductor layer 3, or the active layer 4 and the second conductive semiconductor layer 5. The clad layer may include an AlGaN-based semiconductor.

The second conductive semiconductor layer 5 is formed on the active layer 4. The second conductive semiconductor layer 5 may include a group III-V compound semiconductor doped with a second conductive dopant. For instance, the second conductive semiconductor layer 5 may include GaN, AlN, AlGaN, InGaN, InN, InAlGaN, AlInN, AlGaAs, GaP, GaAs, GaAsP or AlGaInP. If the second conductive semiconductor layer 5 is a P type semiconductor layer, the second conductive dopant is a P type dopant, such as Mg or Zn. The second conductive semiconductor layer 5 may have a single layer structure or a multi-layer structure, but the embodiment is not limited thereto.

Meanwhile, the light emitting structure 6 may further include an N type semiconductor layer on the second conductive semiconductor layer 5. For instance, the light emitting structure 6 may include at least one of an N-P junction, a P-N junction, an N-P-N junction, and a P-N-P junction.

An etching protective layer 7 is formed on a peripheral area of the top surface of the second conductive semiconductor layer 5.

When the isolation etching is performed to separate the light emitting device into a chip unit, the etching protective layer 7 prevents electric short which is caused as metallic material is splashed to the first conductive semiconductor layer 3, the active layer 4 and the second conductive semiconductor layer 5.

The etching protective layer 7 can be formed by alternately stacking two mediums having different refractive indexes. The etching protective layer 7 effectively reflects light emitted from the active layer 4, thereby improving light efficiency of the light emitting device. The etching protective layer 7 will be described later in detail.

Figure 2:
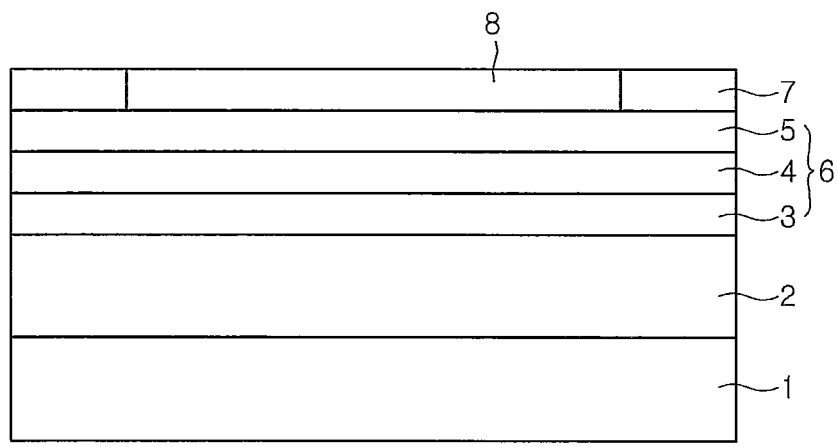

Referring to FIG. 2, a reflective layer 8 is formed on the second conductive semiconductor layer 5.

The reflective layer 8 may include at least one of Ag, Al, Ag—Pd—Cu, and Ag—Cu having higher light reflectivity.

Although not shown in the drawings, an ohmic contact layer can be formed on the second conductive semiconductor layer 5 for ohmic contact and an adhesive layer can be formed on the ohmic contact layer. In this case, the reflective layer 8 is formed on the adhesive layer. Otherwise, the ohmic contact layer is formed on the second conductive semiconductor layer 5 for ohmic contact and the reflective layer 8 is formed on the ohmic contact layer.

For instance, the ohmic contact layer may include ITO (Indium-Tin-Oxide). The ohmic contact layer includes material that permits the ohmic contact with the second conductive semiconductor layer 5.

The adhesive layer may include AZO (Aluminum-Zinc-Oxide) or IZO (Indium-Zinc-Oxide). Since the adhesive layer includes oxide material, light transmittance can be improved. If the AZO or IZO is used as the adhesive layer, the adhesive layer can be formed with large thickness, so material of the reflective layer 8 can be prevented from diffusing into the light emitting structure. The ohmic contact layer and the adhesive layer can be selectively formed according to material of the reflective layer 8.

Figure 3:
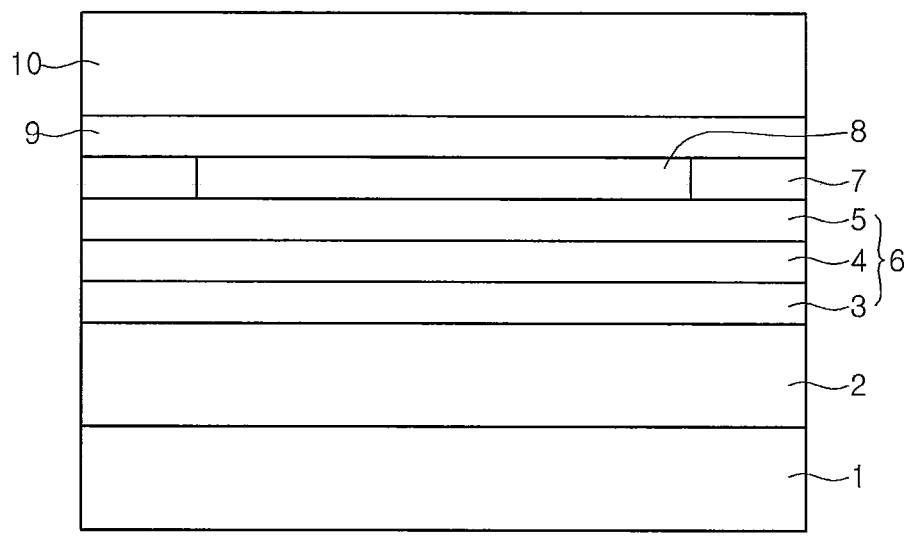

Referring to FIG. 3, a seed layer 9 is formed on the reflective layer 8. The seed layer 9 may include one of Au, Cu, Mo, Pt, Sn and W. A conductive substrate 10 is formed on the seed layer 9. For instance, the conductive substrate 10 can be formed by coating copper onto the seed layer 9.

Instead of forming the seed layer 9 on the reflective layer 8, a bonding layer 9b can be formed on the reflective layer 8 to bond the conductive substrate 10 with the reflective layer 8. In this case, the conductive substrate 10 may include at least one of Ti, Cu, Cr, Ni, Al, Pt, Au, W, Mo and a semiconductor substrate doped with impurities.

Figure 4:
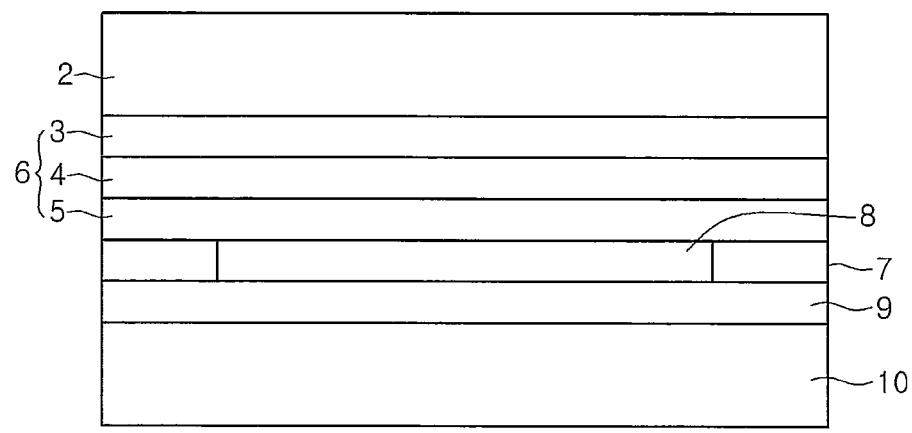

Referring to FIG. 4, in the structure shown in FIG. 3, the growth substrate 1 is removed through an LLO (laser lift off) scheme or a CLO (chemical lift off) scheme. At this time, the nitride semiconductor layer 2 is also removed. According to the embodiment, only the growth substrate 1 is removed.

Figure 5:
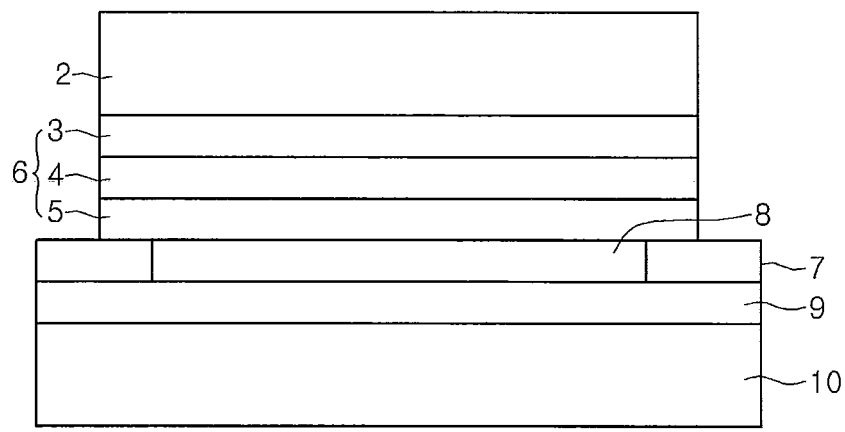

Referring to FIG. 5, an isolation etching process is performed to separate the light emitting device into chip units. The isolation etching process may include an ICP (Induced Coupled Plasma) process. Peripheral portions of the nitride semiconductor layer 2, the first conductive semiconductor layer 3, the active layer 4 and the second conductive semiconductor layer 5 are partially removed through the isolation etching process.

At this time, the etching protective layer 7 is partially exposed. Due to the etching protective layer 7, particles can be prevented from being generated from the seed layer 9, the bonding layer and the conductive substrate 10 and electric short caused by the particles attached to the light emitting structure 6 can be prevented.

Figure 6:
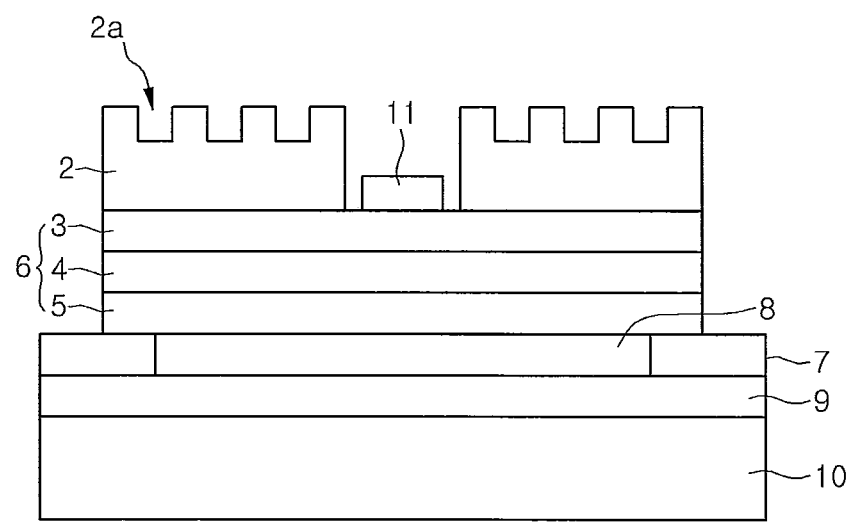

Referring to FIG. 6, the nitride semiconductor layer 2 is selectively removed to form an electrode 11 on the first conductive semiconductor layer 3. In addition, a light extracting structure 2a having a hole shape or a column shape is formed on the top surface of the nitride semiconductor layer 2 in such a manner that the light emitted from the light emitting structure 6 can be effectively extracted upward. In this manner the light emitting device according to the embodiment can be manufactured.

Figure 7A:
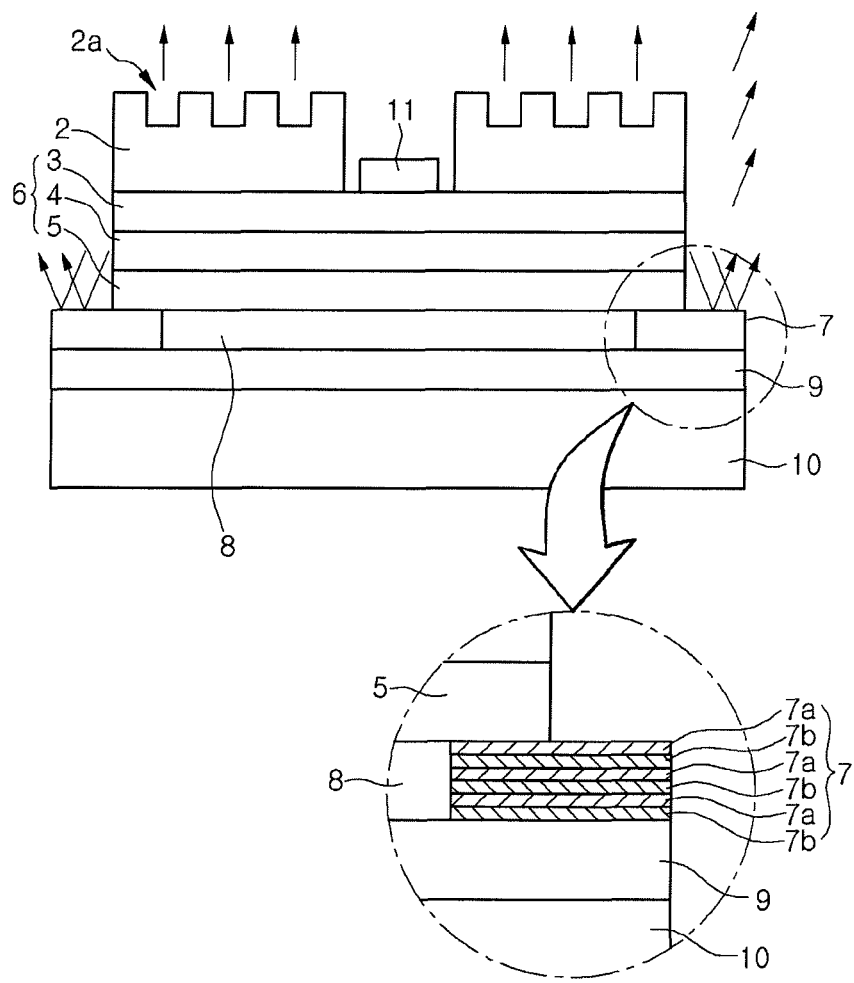
FIGS. 7a and 7b are sectional views showing a light emitting device according to the embodiment.

FIG. 7a is a sectional view showing the light emitting device according to the embodiment.

Figure 7B:
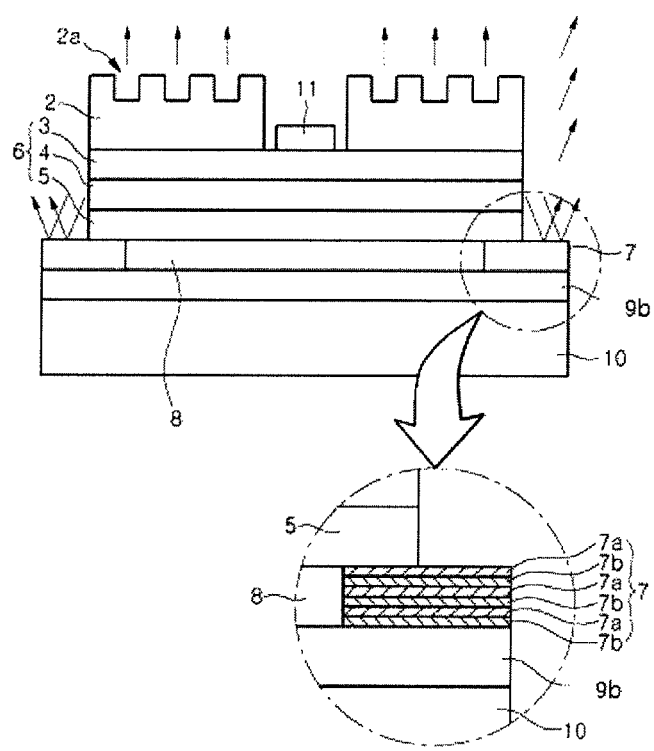

The light emitting devices shown in FIGS. 7a and 7b are manufactured through the method shown in FIGS. 1 to 6.

The light emitting device includes the conductive substrate 10, on which the seed layer 9 or the bonding layer, 9b in FIG. 7b, is formed, and the reflective layer 8 is formed on the center portion of the seed layer 9 or the bonding layer. In addition, the etching protective layer 7 is formed on the peripheral portion of the top surface of the seed layer 9 or the bonding layer.

When the isolation etching process is performed for the light emitting device, the etching protective layer 7 serves as a protective layer to prevent electric short, which is caused as material of the seed layer 9, the bonding layer or the conductive substrate 10 is splashed to the light emitting structure 6. In addition, the etching protective layer 7 reflects the light emitted from the active layer 4 so that degradation of light efficiency, which is caused due to absorption of light into the seed layer 9, the bonding layer or the conductive substrate 10, can be prevented.

The etching protective layer 7 includes a first refractive layer 7a having a first refractive index and a second refractive layer 7b having a second refractive index greater than the first refractive index. A plurality of first and second refractive layers 7a and 7b are formed alternately and repeatedly. At least one pair of first and second refractive layers 7a and 7b are provided. Preferably, at least two pairs of first and second refractive layers 7a and 7b are provided.

The first refractive layer 7a may include at least one of $SiO_2$, having a refractive index of 1.4 and $Al_2O_3$ having a refractive index of 1.7, and the second refractive layer 7b may include at least one of Si having a refractive index of 4.6, Si—H having a refractive index of 3.2, $Si_3N_4$ having a refractive index of 2.0, SiN having a refractive index of 2.0, $TiO_2$ having a refractive index of 2.1 to 2.4 and $ZrO_2$ having a refractive index of 2.1.

The etching protective layer 7 may serve as a DBR (Distributed Bragg Reflector) to increase the reflection factor.

When a wavelength of light emitted from the light emitting device is λ, a refractive index of the first refractive layer 7a or the second refractive layer 7b is n, and m is odd number, the first and second refractive layers 7a and 7b of the etching protective layer 7 are stacked at the thickness of mλ/4n to obtain the reflection factor of 95% or above at a specific wavelength λ of light. For instance, the first refractive layer 7a can be formed with a thickness larger than that of the second refractive layer 7b.

Meanwhile, the reflective layer 8 is formed on the seed layer 9 or the bonding layer. At least a part of the reflective layer 8 is surrounded by the etching protective layer 7. The reflective layer 8 reflects light, which is emitted from the active layer 4 and directed to the conductive substrate 10, such that the light is directed upward, thereby improving light efficiency of the light emitting device.

The light emitting structure 6 including the second conductive semiconductor layer 5, the active layer 4 and the first conductive semiconductor layer 3 is formed on the reflective layer 8, and the nitride semiconductor layer 2 having the light extracting structure 2a is formed on the first conductive semiconductor layer 3. In addition, the electrode 11 is formed on the first conductive semiconductor layer 3.

As indicated by arrows in FIGS. 7a and 7b, a part of light emitted from the light emitting device is directed toward the etching protective layer 7 by passing through a lateral side of the light emitting structure 6. As mentioned above, the etching protective layer 7 has higher light reflectivity so that the light efficiency of the light emitting device can be improved.

Figure 8:
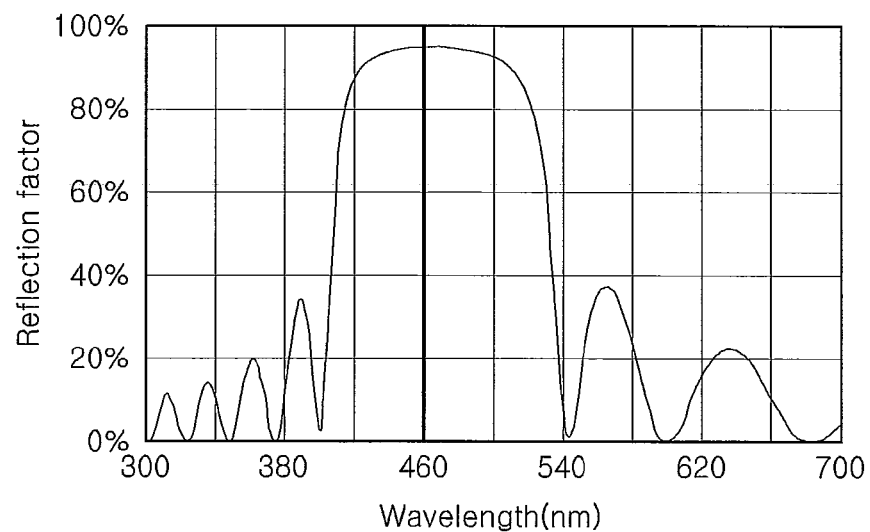
FIGS. 8 and 9 are graphs showing the reflection factor of an etching protective layer in a light emitting device according to the embodiment.
Figure 9:
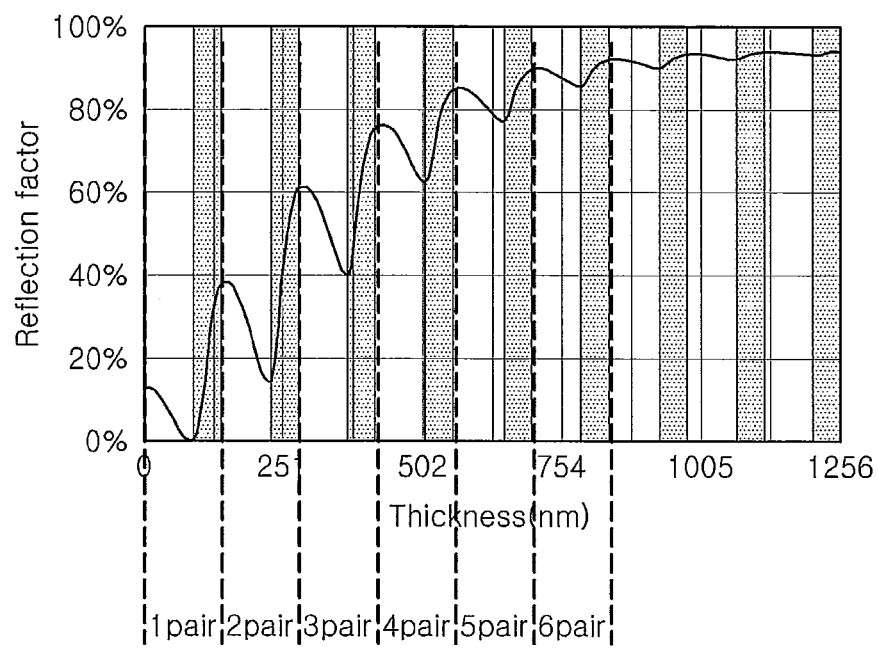
Figure 10:
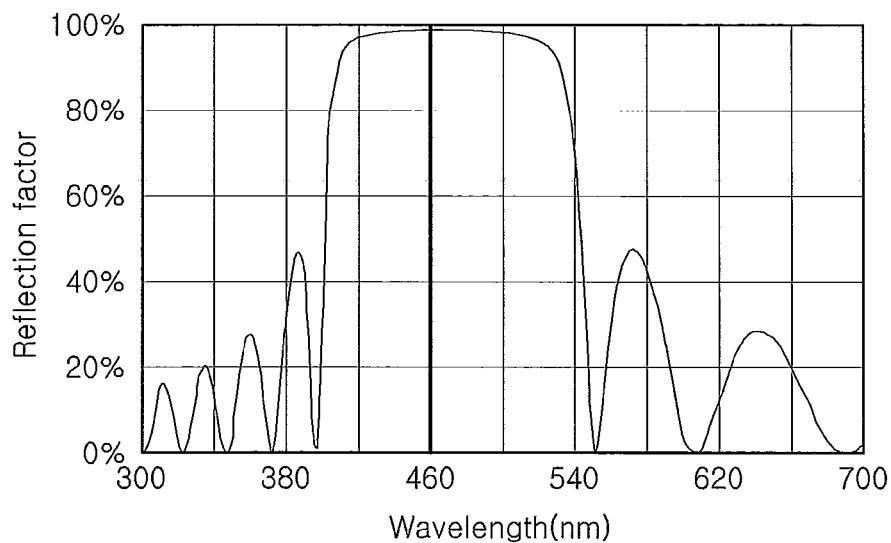
FIGS. 10 and 11 are graphs showing the reflection factor of an etching protective layer in a light emitting device according to another embodiment.
Figure 11:
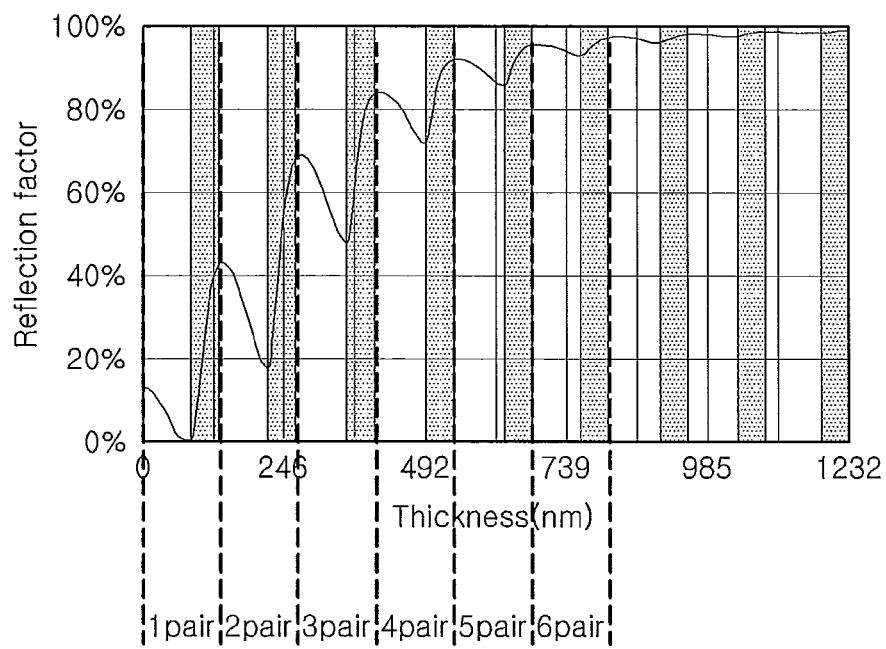

FIGS. 8 and 9 are graphs showing the reflection factor of an etching protective layer in a light emitting device according to the embodiment, and FIGS. 10 and 11 are graphs showing the reflection factor of an etching protective layer in a light emitting device according to another embodiment.

Referring to FIGS. 8 and 9, the reflection factor of the etching protective layer 7 shown in FIGS. 8 and 9 can be obtained when the first refractive layer 7a having a thickness of 82.14 nm and including $SiO_2$ with a refractive index of 1.4 and the second refractive layer 7b having a thickness of 57.5 nm and including SiN with a refractive index of 2.0 are repeatedly formed in the light emitting device that emits light having a wavelength of 460 nm.

Referring to FIG. 8, the reflection factor is represented in a unit of percentage (%) according to the wavelength of the light emitted from the light emitting device. Referring to FIG. 9, the reflection factor is represented in a unit of percentage (%) according to the number of pairs of the first and second refractive layers 7a and 7b.

As shown in FIG. 8, the etching protective layer 7 represents the reflection factor of 90% or above with respect to the light having the wavelength of 400 nm to 540 nm. In addition, as shown in FIG. 9, the reflection factor may increase proportionally to the number of pairs of the first and second refractive layers 7a and 7b.

Referring to FIGS. 10 and 11, the reflection factor of the etching protective layer 7 shown in FIGS. 10 and 11 can be obtained when the first refractive layer 7a having a thickness of 82.14 nm and including $SiO_2$ with a refractive index of 1.4 and the second refractive layer 7b having a thickness of 54.76 nm and including $TiO_2$ with a refractive index of 2.1 are repeatedly formed in the light emitting device that emits light having a wavelength of 460 nm.

Referring to FIG. 10, the reflection factor is represented in a unit of percentage (%) according to the wavelength of the light emitted from the light emitting device. Referring to FIG. 11, the reflection factor is represented in a unit of percentage (%) according to the number of pairs of the first and second refractive layers 7a and 7b.

As shown in FIG. 10, the etching protective layer 7 represents the reflection factor of 90% or above with respect to the light having the wavelength of 400 nm to 540 nm. In addition, as shown in FIG. 11, the reflection factor may increase proportionally to the number of pairs of the first and second refractive layers 7a and 7b.

As described above, the light emitting device according to the embodiment includes the etching protective layer 7 so that the light efficiency can be improved.

Figure 12:
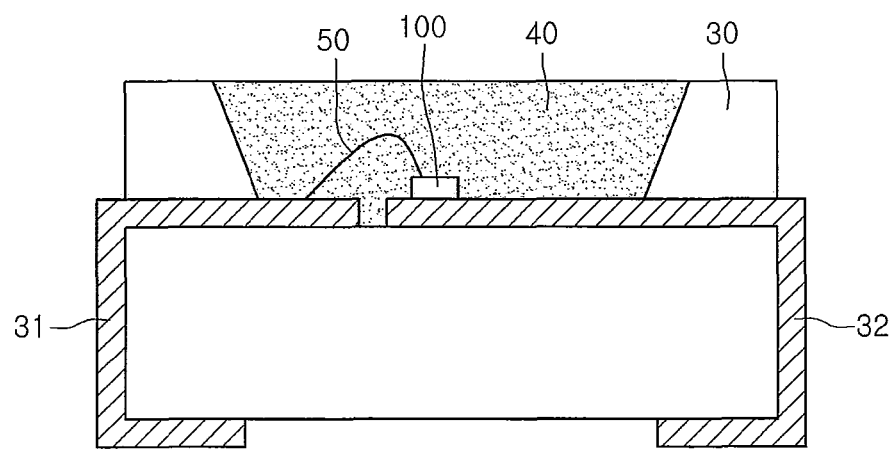
FIG. 12 is a view showing a light emitting apparatus according to the embodiment.

FIG. 12 is a sectional view showing a light emitting device package including the light emitting device according to the embodiments.

Referring to FIG. 12, the light emitting device package according to the embodiments includes a package body 30, first and second electrodes 31 and 32 installed in the package body 30, a light emitting device 100 installed in the package body 30 and electrically connected to the first and second electrodes 31 and 32, and an encapsulating layer 40 surrounding the light emitting device 100.

The package body 30 may include silicon, synthetic resin or metal and may have a cavity with an inclined lateral side.

The first and second electrodes 31 and 32 are electrically separated from each other and supply power to the light emitting device 100. In addition, the first and second electrodes 31 and 32 reflect the light emitted from the light emitting device 100 to improve the light efficiency and dissipate heat generated from the light emitting device 100 to the outside.

The light emitting devices as shown in FIGS. 7a and 7b can be used as the light emitting device 100. The light emitting device 100 can be installed on the package body 30, the first electrode 31 or the second electrode 32.

The light emitting device 100 can be electrically connected to the first and second electrodes 31 and 32 through a wiring scheme, a flip chip scheme or a die bonding scheme. According to the embodiment, the light emitting device 100 is electrically connected to the first electrode 31 through a wire 50 while directly making contact with the second electrode 32.

The encapsulating layer 40 surrounds the light emitting device 100 to protect the light emitting device 100. In addition, the encapsulating layer 40 may include a phosphor to vary the wavelength of the light emitted from the light emitting device 100.

The light emitting apparatus may include at least one light emitting device according to the embodiment. The embodiment may not limit the number of the light emitting devices.

A plurality of light emitting device package according to the embodiment can be arranged on the substrate. In addition, optical members, such as a light guide plate, a prism sheet and a diffusion sheet, can be arranged in a path of light emitted from the light emitting device package. The light emitting device package, the substrate, the optical members may serve as a lighting device. According to another embodiment, a display device, an indicating device, or a lighting system can be established by using the light emitting device or the light emitting device package. For instance, the lighting system may include a lamp or a street lamp.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a conductive substrate;
   a reflective layer on the conductive substrate;
   an etching protective layer on the conductive substrate, the etching protective layer having an outer edge and an inner edge; and
   a light emitting structure, which is formed on the reflective layer and the etching protective layer such that the etching protective layer is partially exposed and includes a first conductive semiconductor layer, a second conductive semiconductor layer and an active layer between the first and second conductive semiconductor layers; and a bonding layer between the conductive substrate and the reflective layer,
   wherein the etching protective layer includes a first refractive layer having a first refractive index and a second refractive layer having a second refractive index greater than the first refractive index, and
   wherein a bottom surface of the reflective layer is flush with a bottom surface of the etching protective layer.

2. The light emitting device of claim 1, wherein the first and second refractive layers are stacked alternately.

3. The light emitting device of claim 1, wherein the first refractive layer includes at least one of $SiO_2$ and $Al_2O_3$.

4. The light emitting device of claim 1, wherein the second refractive layer includes at least one of Si, Si—H, $Si_3N_4$, SiN, $TiO_2$ and $ZrO_2$.

5. The light emitting device of claim 1, further comprising a nitride semiconductor layer having a light extraction structure on the light emitting structure.

6. The light emitting device of claim 1, wherein at least two pairs of first and second refractive layers are provided.

7. The light emitting device of claim 1, wherein the first and second refractive layers have thickness of $m\lambda/4n$ respectively, in which $\lambda$ is a wavelength of light emitted from the light emitting structure, n is a refractive index of the first refractive layer or the second refractive layer, and m is an odd number.

8. The light emitting device of claim 1, wherein the first refractive layer is thicker than the second refractive layer.

9. A lighting system comprising:
   a light emitting device package including the light emitting device of claim 1;
   a substrate on which the light emitting device package is arranged; and
   at least one of optical members selected from group consisting of a light guide plate, a prism sheet and a diffusion sheet, the at least one of optical members being arranged in a path of light emitted from the light emitting device package.

10. The light emitting device of claim 1, wherein the first refractive layer is disposed on the bonding layer.

11. The light emitting device of claim 1, wherein the light emitting structure is disposed on the second refractive layer.

12. The light emitting device of claim 1, wherein the etching protective layer is disposed only on a peripheral portion of a top surface of the bonding layer.

13. The light emitting device of claim 1, further comprising an electrode on the light emitting structure,
   wherein the etching protective layer does not vertically overlap with the electrode.

14. The light emitting device of claim 1, wherein a lateral width of the reflective layer is larger than a width between the inner edge and outer edge of the etching protective layer.

* * * * *